United States Patent [19]

Watanabe et al.

[11] Patent Number: 5,759,264
[45] Date of Patent: Jun. 2, 1998

[54] METHOD FOR VAPOR-PHASE GROWTH

[75] Inventors: Masataka Watanabe; Tsuneyuki Kaise; Masayuki Shinohara; Masahisa Endo, all of Gunma-ken, Japan

[73] Assignee: Shin-Etsu Handotai Co., Ltd., Tokyo, Japan

[21] Appl. No.: 619,294

[22] Filed: Mar. 21, 1996

[51] Int. Cl.⁶ .................................................. C30B 25/14
[52] U.S. Cl. .................................. 117/101; 117/88; 117/902; 117/954
[58] Field of Search .......................... 117/101, 902, 117/954, 88

[56] References Cited

U.S. PATENT DOCUMENTS

| | | |
|---|---|---|
| 3,539,759 | 11/1970 | Spiro et al. ........................ 117/101 |
| 3,682,699 | 8/1972 | Koga et al. ........................ 117/101 |
| 4,263,087 | 4/1981 | Tanabe et al. ..................... 117/101 |
| 4,728,389 | 3/1988 | Logar ................................ 117/101 |
| 4,772,356 | 9/1988 | Schumaker et al. ............... 117/101 |

*Primary Examiner*—Robert Kunemund
*Attorney, Agent, or Firm*—Ronald R. Snider

[57] ABSTRACT

A method for a vapor-phase growth of a $GaAs_{1-x}P_x$ epitaxial layer having a uniform thickness is disclosed. This method allows the $GaAs_{1-x}P_x$ epitaxial layer (wherein x stands for an alloy composition satisfying the expression, $0 \leq x \leq 1$) to be formed on a plurality of semiconductor single crystal substrates 1 by setting the semiconductor single crystal substrates 1 in place on a wafer holder 16 disposed inside a vapor-phase growth apparatus 30 in an amount of not less than 70% as the covering ratio of the total surface area of the substrates to the surface area of the wafer holder 16.

3 Claims, 3 Drawing Sheets

METHOD FOR VAPOR-PHASE GROWTH

BACKGROUND OF THE INVENTION

1. Field of the Invention

This invention relates to a method for a vapor-phase growth of an epitaxial layer(s) of a compound semiconductor and more particularly to a method for a vapor-phase growth of a GaAs$_{1-x}$P$_x$ epitaxial layer (wherein x stands for a composition in the range, $0 \leq x \leq 1$).

2. Description of the Prior Art

The GaAsP epitaxial wafer obtained by forming a GaAs$_{1-x}$P$_x$ epitaxial layer(s) (wherein x stands for an alloy composition in the range, $0 \leq x \leq 1$) on a GaP or a GaAs single crystal substrate is used for a yellow to red light-emitting diode.

The GaAsP epitaxial wafer mentioned above, for example, has such a sectional structure as shown in FIG. 1, in which 1 stands for an n-type GaP single crystal substrate of 300 μm in thickness, 2 to 5 for epitaxially grown layers having a total thickness of 50 μm, specifically 2 for an n-type GaP layer of 3 μm in thickness, 3 for an n-type GaAs$_{1-x}$P$_x$ graded layer having the GaP alloy composition x, decreased from 1 to a necessary value of x (x$_0$) and a thickness of 25 μm, 4 for a n-type GaAs$_{1-x}$P$_x$ composition constant layer having the alloy composition, x, constant at x$_0$ and a thickness of 8 μm, and 5 for a nitrogen-doped n-type GaAs$_{1-x}$P$_x$ composition constant layer having the alloy composition, x, constant at x$_0$ and a thickness of 14 μm.

The GaAsP light-emitting diode is obtained by diffusing Zn into the aforementioned GaAsP epitaxial wafer 10 through the obverse surface side of the nitrogen-doped n-type GaAs$_{1-x}$P$_x$ composition constant layer 5 thereby giving rise to a p-n junction having a p-type diffused layer of 4 to 5 μm in thickness and, thereafter, dicing to a necessary configuration.

In the GaAsP light-emitting diode mentioned above, the nitrogen-doped n-type GaAs$_{1-x}$P$_x$ composition constant layer 5 emits light of a wavelength which is corresponding to the GaP alloy composition, x.

For example, the GaAs$_{0.15}$P$_{0.85}$ which satisfies the expression, x=0.85, emits yellow light having a peak wavelength of about 585 nm, and the GaAs$_{0.35}$P$_{0.65}$ which satisfies the expression, x=0.65, emits orange light having a peak wavelength of about 630 nm.

The GaAsP epitaxial wafer mentioned above is generally produced by a method of vapor-phase epitaxial growth, hereinafter referred to as "method for vapor-phase growth", such as, for example, the method of the hydride type vapor-phase growth. The GaAsP epitaxial wafer(s) is obtained by setting the n-type single crystal substrate(s) on a wafer holder 16 inside a vapor-phase growth apparatus 30, using phosphine (PH$_3$), arsine (AsH$_3$), and hydrogen chloride (HCl; providing HCl which reacts with Ga 17 in a Ga storage vessel 14 to form GaCl) as source gases, hydrogen sulfide (H$_2$S) as an n-type dopant source, ammonia (NH$_3$) as a nitrogen source, and hydrogen (H$_2$) as a carrier gas, and feeding these gases by setting amounts and temperatures in accordance with the GaP alloy composition, x (for a composition satisfying the expression, $0 \leq x \leq 1$) mentioned above thereby sequentially forming the epitaxially grown layers 2, 3, 4, and 5 in the order on the n-type GaP single crystal substrate 1.

Heretofore, the GaAsP epitaxial wafer has been produced by the method described above with the amount of the n-type GaP single crystal substrate 1, or the n-type GaAs single crystal substrate) 1, placed on the wafer holder 16 at a covering level in a range of 55 to 60% as the ratio of the total area of the substrate to the area of the wafer holder 16, hereinafter referred to as "covering ratio of substrate".

When the covering ratio of substrate is in the range of 55 to 60%, however, the total thickness of the epitaxially grown layers in the central part and the total thickness of the epitaxially grown layers in the peripheral part of a GaAsP epitaxial wafer 10' inevitably produce a difference of about 2 times in the ratio of these total thicknesses as shown in FIG. 3.

When the GaAsP epitaxial wafer involving such a large dispersion in the total thickness of epitaxially grown layers as mentioned above (also involving a similarly large dispersion in the thickness of the GaAsP epitaxial wafer) is used as a substrate for a GaAsP light-emitting diode, the following problems are entailed.

The large dispersion of thickness in the individual wafers (1) forms the cause of a large decrease in the yield during the process of manufacture of light-emitting diode chips, hereinafter referred to as "LED chips", and (2), owing to the large difference in total thickness (height) in the individual LED chips, causes troubles in the process of assemblage by the use of an automated device, suffer an increased loss of process time, and induce a decrease in the yield of the process of assemblage.

Further, from the viewpoint of the characteristics of a light-emitting diode, the large dispersion of total thickness of the epitaxially grown layers mentioned above (1) causes a large dispersion of a forward voltage (V$_F$) and particularly aggravates the defect of this voltage, V$_F$, in those light-emitting diodes which originate in the peripheral part of a wafer and (2) impairs the uniformity of the luminance and the color of the light to be emitted.

For the purpose of precluding the various problems mentioned above, a GaAsP epitaxial wafer which comprise epitaxially grown layers having a uniform total thickness ([largest thickness in the whole area of wafer]/[smallest thickness in the whole area of wafer] $\leq 1.5$) has been desired.

SUMMARY OF THE INVENTION

This invention, therefore, is directed to the production of a GaAsP epitaxial wafer and has for an object thereof the provision of a method for the vapor-phase growth which obtains a GaAs$_{1-x}$P$_x$ epitaxial layer(s) (wherein x stands for an alloy composition satisfying the expression, $0 \leq x \leq 1$) having a uniform thickness.

To accomplish the object of obtaining a GaAs$_{1-x}$P$_x$ epitaxial layer(s) ($0 \leq x \leq 1$) having a uniform thickness, this invention provides a method for a vapor-phase growth comprising the steps of setting a plurality of semiconductor single crystal substrates in place on a wafer holder disposed in a vapor-phase growth apparatus and forming a GaAs$_{1-x}$P$_x$ epitaxial layer(s) ($0 \leq x \leq 1$) on the semiconductor single crystal substrates by means of vapor-phase growth, characterized in that a covering ratio of a total surface area of charged semiconductor single crystal substrates to the surface area of a wafer holder is not less than 70%.

The material for the wafer holder mentioned above is selected from carbon or quartz, and the single crystal as the material for the semiconductor single crystal substrates is selected from GaP or GaAs.

When the semiconductor single crystal substrates are set in place on the wafer holder made of carbon or quartz and the GaAs$_{1-x}$P$_x$ epitaxial layer(s) ($0 \leq x \leq 1$) is formed by vapor-phase growth on the substrates, virtually no $GaAs_{1-x}P_x$ ($0 \leq x \leq 1$) is deposited on the surface of the wafer holder because the activation energy of the reaction for the growth of $GaAs_{1-x}P_x$ on the surface of the wafer holder is extremely large as compared with that on the surface of the substrates [inclusive of a surface of the $GaAs_{1-x}P_x$ epitaxial layer ($0 \leq x \leq 1$) formed by the vaporphase growth]. The concentration of the source gases (GaCl and $P_4$ formed by decomposition of $PH_3$ and/or $As_4$ formed by decomposition of $AsH_3$) flowing on the substrates, therefore, is abnormally high in the peripheral part of the substrates as compared with that in the central part thereof. As a result, conspicuous lack of uniformity occurs in the thickness of the epitaxial layer(s) as shown in FIG. 3.

The present inventors have continued a diligent study based on the knowledge mentioned above and consequently found that the $GaAs_{1-x}P_x$ epitaxial layer(s) can be formed in a uniform thickness by vapor-phase growth by increasing the covering ratio of the substrates mentioned above.

In this invention, when the amount of the semiconductor single crystal substrates to be charged for vapor-phase growth is set at a level of not less than 70% as the covering ratio of the total surface area to the surface area of the wafer holder, the phenomenon that the concentration of source gases is unduly heightened in the peripheral part of the substrates as compared with that in the central part thereof and the uniformity of thickness of the epitaxial layer(s) is impaired because the activation energy of the reaction for the growth of the $GaAs_{1-x}P_x$ is extremely large on the surface of the wafer holder as compared with that on the surface of the substrates can be inhibited.

Specifically, by decreasing the ratio of the area of the holder surface on which the reaction for epitaxial deposition fails to occur, good uniformity of the concentration of the source gases flowing on the central part and on the peripheral part of the substrates can be achieved, and as a result, the uniformity of the thickness of the epitaxial layer(s) can be consequently augmented.

The augmented uniformity of the thickness of the epitaxial layer(s) results in decreasing the dispersion of wafer thickness, (1) increasing the yield of the process of production of LED chips, (2) uniformizing the thickness of LED chips, diminishing the troubles incurred during the process of assemblage of LED chips by an automated device, decreasing the time loss of this process, and further improving the yield of the process of assemblage.

From the viewpoint of the characteristics of light-emitting diode, the uniformization of the thickness of the epitaxial layer(s) mentioned above results in (1) diminishing the dispersion of the forward voltage ($V_F$) and (2) uniformizing the luminance and the color of the light to be emitted.

BRIEF DESCRIPTION OF THE DRAWINGS

The invention will be better understood and objects, features, and characteristics thereof other than those set forth above will become apparent when consideration is given to the following detailed description thereof. Such description makes reference to the annexed drawings wherein.

DETAILED DESCRIPTION OF PREFERRED EMBODIMENTS

This invention will be described more specifically below with reference to working examples.

(EXAMPLE 1)

Figure 1:
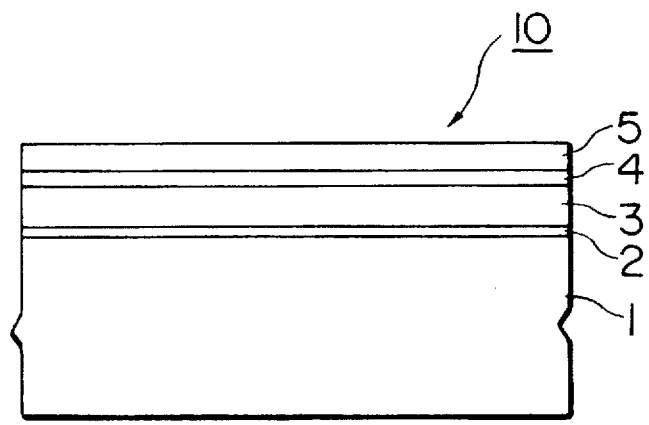
FIG. 1 is a sectioned structural diagram of a GaAsP epitaxial wafer.

GaAsP epitaxial wafers (GaAsP epitaxial wafers for yellow light-emitting diodes in this example) of a structure shown in FIG. 1 were produced as follows.

Figure 2:
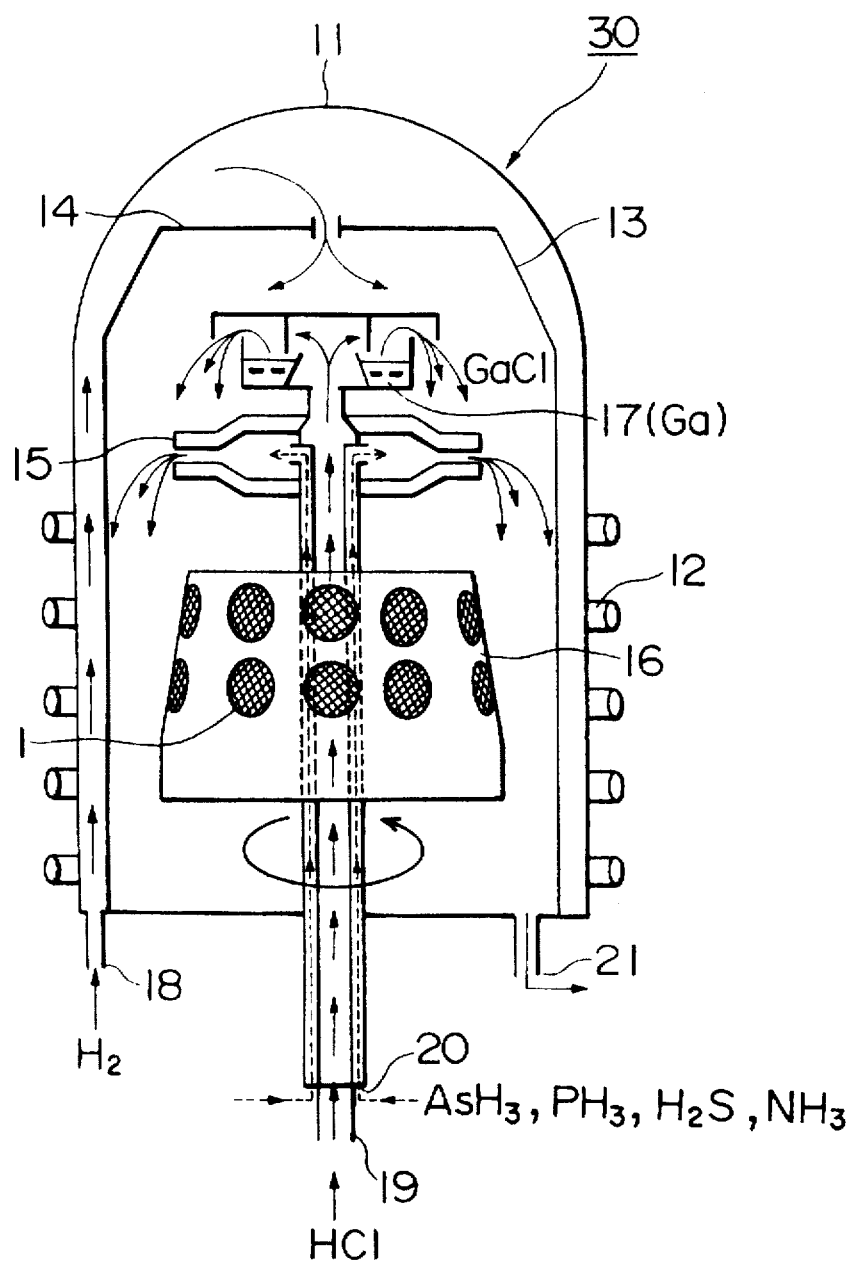
FIG. 2 is a schematic structural diagram of a vapor-phase growth apparatus to be used for the production of a GaAsP epitaxial wafer of the example.
Figure 3:
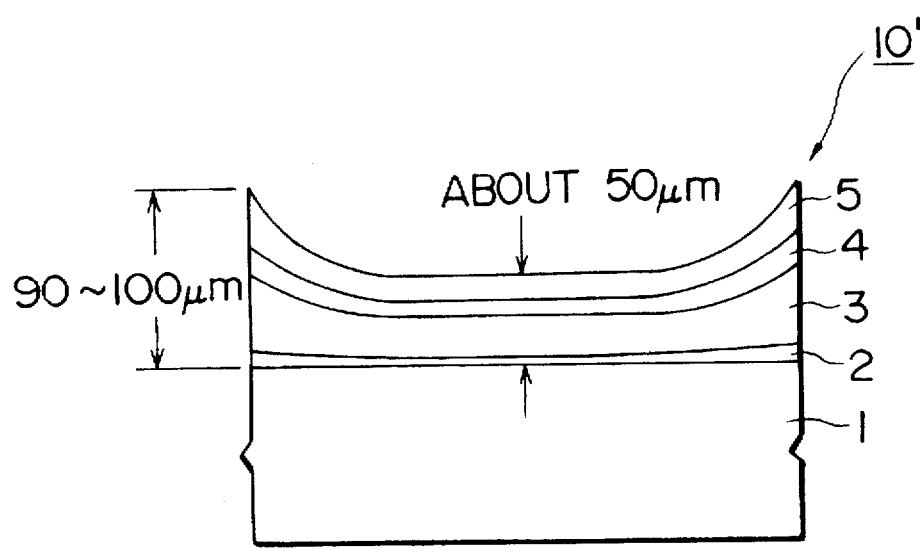
FIG. 3 is a sectioned structural diagram of a GaAsP epitaxial wafer to be obtained by a conventional method for vapor-phase growth.

FIG. 2 is a schematic structural diagram of a vapor-phase growth apparatus used for the production of the GaAsP epitaxial wafers of this example. In the diagram, 1 stands for an n-type GaP single crystal substrate, 11 for a quartz bell jar, 12 for a high-frequency induction heating coil, 13 for a high-frequency susceptor, 14 for a Ga storing vessel, 15 for a gas mixer, 16 for a wafer holder, 17 for Ga, 18 for a carrier gas ($H_2$) inlet, 19 for an HCl inlet, 20 for an inlet for $PH_3$, $AsH_3$, $H_2S$, and $NH_3$ gases, and 21 for a gas outlet.

A mirror-polished wafer having a surface off-angled by 10° from the plane of {100} to the direction of <110> as a main surface, a thickness of 300 μm, and a Te impurity concentration in the range of 2 to $4 \times 10^{17}$ atoms/cm$^3$ were used as the n-type GaP single crystal substrate 1.

The gases used for the vapor-phase growth were hydrogen ($H_2$), hydrogen sulfide ($H_2S$) diluted with $H_2$ to a concentration of 50 ppm, arsine ($AsH_3$) diluted with $H_2$ to a concentration of 1%, phosphine ($PH_3$) diluted with $H_2$ to a concentration of 10%, hydrogen chloride (HCl) of a high purity, and ammonia gas ($NH_3$). Hereinafter, the gases mentioned above will be referred to briefly as $H_2$, $H_2S/H_2$, $PH_3/H_2$, HCl, and $NH_3$ respectively.

The n-type GaP single crystal substrates 1 were set in place on the wafer holder 16 disposed inside the vapor-phase growth apparatus 30 at a covering ratio (the ratio of the total surface area of the substrates 1 charged to the surface area of the wafer holder) of 80%.

Nitrogen gas ($N_2$) and then hydrogen gas ($H_2$) as a carrier gas were introduced into the vapor-phase growth apparatus 30 until thorough displacement of the interior of the growth apparatus 30. Then, the growth apparatus 30 was heated until the temperature of the substrates 1 reached to 860° C. Subsequently, vapor-phase growth of a $GaAs_{1-x}P_x$ epitaxial layer for yellow-color light emission was started.

First, the $H_2S/H_2$ was introduced at a flow volume of 10 cc/minute, the HCl was introduced meanwhile at a flow volume of 45 cc/minute and caused to react with the Ga 17 in the Ga storage vessel 14 to give birth to GaCl, and the $PH_3/H_2$ was introduced simultaneously at a flow volume of 250 cc/minute to induce growth of the n-type GaP layer 2 in a target thickness of 3 μm on the n-type GaP single crystal substrates 1.

Then, the n-type $GaAs_{1-x}P_x$ of a graded layer 3 was grown to a target thickness of 25 μm by the following procedure. The GaP alloy composition ratio x was decreased from 1 to 0.85 by introducing the $H_2S/H_2$, HCl, and $PH_3/H_2$ at respective fixed flow volumes of 10 cc/minute, 45 cc/minute, and 250 cc/minute and the $AsH_3/H_2$ at a flow volume gradually increased from 0 cc/minute to 260 cc/minute. Meanwhile, the temperature of the substrates 1 was decreased from 860° C. to 830° C. Thus, the n-type $GaAs_{1-x}P_x$ graded layer 3 having an alloy composition varied from GaP to $GaAs_{0.15}P_{0.85}$ was grown on the n-type GaP layer 2 mentioned above.

Then, with the temperature of the substrates 1 set at 830° C. the $H_2S/H_2$, HCl, $PH_3/H_2$, and $AsH_3/H_2$ were introduced at respective flow volumes of 10 cc/minute, 45 cc/minute, 250 cc/minute, and 260 cc/minute to attain growth of the n-type $GaAs_{0.15}P_{0.85}$ composition constant layer 4 to a target thickness of 8 μm.

Finally, with the flow volumes of the $H_2S/H_2$, HCl, $PH_3/H_2$, and $AsH_3/H_2$ and the temperature of the substrates 1 set at the same levels as were used during the growth of the n-type $GaAs_{0.15}P_{0.85}$ composition constant layer 4, the $NH_3$ was introduced at a flow volume of 400 cc/minute to effect growth of a nitrogen-doped n-type $GaAs_{0.15}P_{0.85}$ composition constant layer 5, to a target thickness of 14 μm and complete the production of the GaAsP epitaxial wafer for a yellow light-emitting diode. The total thickness of the epitaxially grown layers of the GaAsP epitaxial wafers produced as described above were measured. The results are shown in Table 1.

(EXAMPLE 2)

GaAsP epitaxial wafers for yellow light-emitting diodes were produced by following the procedure of Example 1 while setting the covering ratio of the substrates at 70%. The total thickness of the epitaxially grown layers were measured in the same manner as in Example 1. The results are also shown in Table 1.

[Comparative Example 1 and Comparative Example 2]

GaAsP epitaxial wafers for yellow light-emitting diodes were produced by following the procedure of Example 1 while setting the covering ratios of substrates at 55% (Comparative Example 1) and 60% (Comparative Example 2). The total thickness of the component epitaxially grown layers were measured in the same manner as in Example 1. The results are also shown in Table 1.

TABLE 1

| | Covering ratio of substrates (%) | Thickness of epitaxial layers (μm)* | | |
|---|---|---|---|---|
| | | Minimum value (Central part) | Maximum value (Peripheral part) | Maximum value / Minimum value |
| Example 1 | 80 | 50.3 | 65.4 | 1.30 |
| Example 2 | 70 | 50.8 | 74.2 | 1.46 |
| Comparative Example 1 | 60 | 49.5 | 90.6 | 1.83 |
| Comparative Example 2 | 55 | 50.6 | 101.8 | 2.01 |

The ratios of [maximum thickness in wafer]/[minimum thickness in wafer] (hereinafter referred to as Max/Min) were 1.30 and 1.46 respectively when the covering ratio of substrates were set at 80% (Example 1) and 70% (Example 2). These values are smaller than the target maximum of 1.5. This fact indicates that the magnitudes of dispersion of layer thickness were smaller than the tolerable maximum level.

From these results, it is found that the increase of the covering ratio of substrates from 70% to 80% resulted in decreasing the Max/Min indicative of the magnitude of dispersion of thickness of the epitaxial layers from 1.46 to 1.30 and better the uniformity of thickness of the epitaxial layer(s). It is further noted that the covering ratio of substrates which satisfies the target uniformity of dispersion of layer thickness (Max/Min ≦ 1.5) is not less than 70%.

The examples cited above represent the cases of setting the substrates in place substantially vertically inside the vapor-phase growth apparatus. Similarly satisfactory results are obtained when the substrates are set in place horizontally instead.

The examples further represent cases of using a GaP single crystal substrates as the substrates. Similarly satisfactory results are obtained when GaAs single crystal substrates are used instead.

It is clearly remarked from the description given above that this invention uniformizes the concentration of source gases flowing on the central part and on the peripheral part of the substrates and consequently makes better the uniformity of the epitaxial layer(s) by setting the amount of charging of the semiconductor single crystal substrates at a level of not less than 70% as the covering ratio of the total surface area of the semiconductor single crystal substrates to the surface area of the wafer holder and consequently decreasing the ratio of the surface of the holder on which the reaction for epitaxial deposition does not occur.

The better uniformity of the thickness of the epitaxial layer(s) results in decreasing the dispersion of wafer thickness, (1) increasing the yield of the process of production of LED chips, (2) uniformizing the thickness of LED chips, diminishing the troubles incurred during the process of assemblage of LED chips by an automated device, decreasing the time loss of this process, and further improving the yield of the process of assemblage.

From the viewpoint of the characteristics of light-emitting diode, the uniformization of the thickness of the epitaxial layer(s) mentioned above results in (1) diminishing the dispersion of the forward voltage ($V_F$) and (2) uniformizing the luminance and the color of the light to be emitted.

While there have been shown and described present preferred embodiments of the invention, it is to be distinctly understood that the invention is not limited thereto but may be otherwise variously embodied and practiced within the scope of the following claims.

What is claimed is:

1. A method for a vapor-phase growth of a $GaAs_{1-x}P_x$ layer, comprising the steps of setting a plurality of semiconductor single crystal substrates in place on a wafer holder disposed in a vapor-phase growth apparatus and forming a $GaAs_{1-x}P_x$ epitaxial layer(s) (wherein x stands for an alloy composition satisfying the expression, $0 \leq x \leq 1$) on said semiconductor single crystal substrates by means of vapor-phase growth, characterized in that a covering ratio of the total surface area of charged semiconductor single crystal substrates to a surface area of said wafer holder is not less than 70%.

2. The method according to claim 1, wherein the material for said wafer holder is either carbon or quartz.

3. The method according to claim 1, wherein the single crystal as the material for said semiconductor single crystal substrates is either GaP or GaAs.

* * * * *